(12) United States Patent
Taylor

(10) Patent No.: US 7,438,582 B2
(45) Date of Patent: Oct. 21, 2008

(54) FLEXIBLE CIRCUIT CONNECTOR ASSEMBLY

(75) Inventor: Paul R. Taylor, Mechanicsburg, PA (US)

(73) Assignee: Amphenol Corporation, Wallingford, CT (US)

(*) Notice: Subject to any disclaimer, the term of this patent is extended or adjusted under 35 U.S.C. 154(b) by 0 days.

(21) Appl. No.: 11/751,078

(22) Filed: May 21, 2007

(65) Prior Publication Data

US 2008/0227314 A1 Sep. 18, 2008

Related U.S. Application Data

(60) Provisional application No. 60/871,628, filed on Dec. 22, 2006.

(51) Int. Cl.
H01R 4/50 (2006.01)
(52) U.S. Cl. ...................................... 439/342
(58) Field of Classification Search ................. 439/378, 439/449, 492, 493
See application file for complete search history.

(56) References Cited

U.S. PATENT DOCUMENTS

| | | | |
|---|---|---|---|
| 4,824,379 A | 4/1989 | Roberts et al. | |
| 4,948,374 A | 8/1990 | Carter | |
| 4,950,980 A * | 8/1990 | Pfaff | 324/755 |
| 6,282,093 B1 | 8/2001 | Goodwin | |
| 6,563,716 B1 | 5/2003 | Truong et al. | |
| 6,612,851 B1 | 9/2003 | Goodwin et al. | |
| 6,634,830 B1 | 10/2003 | Marshall | |
| 6,639,800 B1 | 10/2003 | Eynan et al. | |
| 6,755,683 B2 * | 6/2004 | Roberts et al. | 439/496 |
| 6,835,072 B2 | 12/2004 | Simons et al. | |
| 6,887,090 B2 * | 5/2005 | Lin et al. | 439/342 |
| 6,893,283 B2 * | 5/2005 | Yu | 439/342 |
| 6,929,484 B2 | 8/2005 | Weiss et al. | |
| 7,004,760 B2 | 2/2006 | Kawazoe et al. | |
| 7,033,200 B2 * | 4/2006 | Cui et al. | 439/342 |
| 7,046,020 B2 * | 5/2006 | LaMeres et al. | 324/754 |
| 7,320,617 B1 * | 1/2008 | Bellato et al. | 439/496 |
| 7,323,892 B1 * | 1/2008 | LaMeres et al. | 324/754 |

* cited by examiner

*Primary Examiner*—Chandrika Prasad
(74) *Attorney, Agent, or Firm*—Hooker & Habib, P.C.

(57) ABSTRACT

An electrical connector assembly for connecting a flexible circuit to a circuit board includes a flexible circuit attached to a clamp member and a plurality of alignment posts extending from the circuit board. The clamp member has notches that receive the posts to place the contact field of the flexible circuit above the contact field of the circuit board. A spring assembly attached to the clamp member has a manually-operated drive that moves a cam member deflecting the spring against the posts, generating a spring force pressing the clamp member against the circuit board. Barriers formed on the posts prevent contact of the flexible circuit with the circuit board until the contact fields are properly aligned.

23 Claims, 4 Drawing Sheets

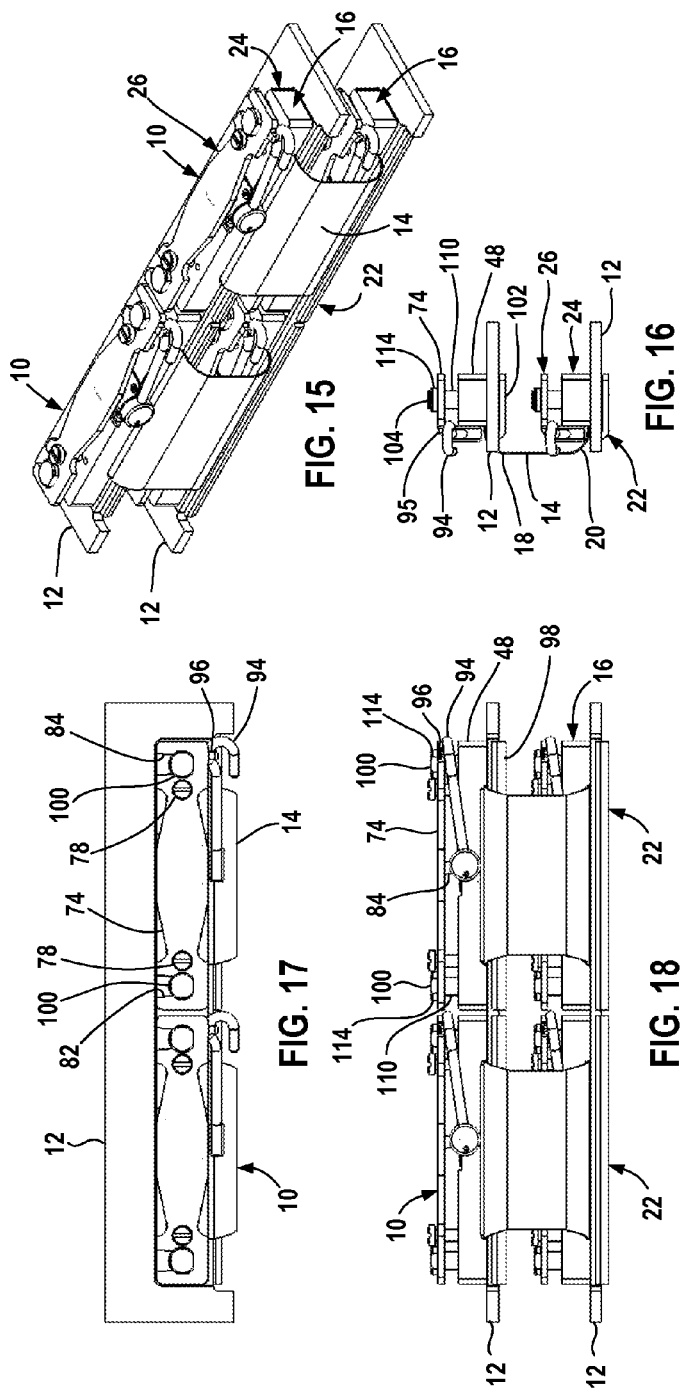

FLEXIBLE CIRCUIT CONNECTOR ASSEMBLY

This application claims priority to my co-pending provisional patent filed on Dec. 22, 2006 and having Application No. 60/871,628.

FIELD OF THE INVENTION

The invention relates to an electrical connector having a flexible circuit for forming electrical connections between closely spaced contacts of the flexible circuit and closely spaced contacts of a circuit board.

BACKGROUND OF THE INVENTION

Electrical connectors are used to form electrical connections between a circuit board having a high density of electrical contacts and another electrical component. The contacts are arranged in a series of rows and columns in a contact field on one side of the circuit board. The contacts are closely spaced together and a large number of contacts are included in a relatively small area.

Electrical connectors having a flexible circuit that interconnects the circuit board with the other electrical component have been developed. The flexible circuit includes a contact field having contacts arranged in rows and columns corresponding to the rows and columns of contacts on the circuit board. The flexible circuit is mounted on a clamp member on the opposite side of the flexible circuit from the contacts. The clamp member carries an elastomeric spring that faces the flexible circuit.

To connect the electrical connector to the circuit board, the clamp member is placed adjacent to the circuit board. The clamp member is then moved to position the contact field of the flexible circuit directly over the contact field of the circuit board. The clamp member is pressed against the circuit board and fastened against the circuit board by threaded fasteners inserted through the clamp member and circuit board. The fasteners are tightened using screwdrivers or other tools to clamp the clamp member against the circuit board and compress the spring between the clamp member and the flexible circuit. The compressed spring generates a spring force pressing the flexible circuit contacts against the circuit board contacts, electrically interconnecting the contacts fields.

Circuit boards may be installed in systems that do not permit the use of tools or loose fasteners when servicing system components because the risk of damage is too high. The tool or fastener may inadvertently damage a contact field on the flexible circuit or on the circuit board, or may inadvertently damage other components of the system.

Yet electrical connectors must often be detached from circuit boards to service the system, and then reattached to the circuit boards. It would be desirable to provide an electrical connector with a flexible circuit that can be detached from a circuit board and then reattached without the need of tools or loose fasteners.

Furthermore, the contacts on the flexible circuit and on the circuit board can be damaged while the flexible circuit is being attached to or detached from the circuit board. Dragging the contact field of the flexible circuit against the contact field of the circuit board while connecting or disconnecting the electrical connector may damage some of the contacts. The contacts may be damaged to such an extent that they cannot form electrical connections.

Thus there is a need for an improved electrical connector having a flexible circuit that can be attached to and detached from a circuit board without tools and without loose fasteners. The electrical connector should resist inadvertent contact between the contacts of the flexible circuit and the contacts of the circuit board while connecting or disconnecting the electrical connector and circuit board.

SUMMARY OF THE INVENTION

The invention is an improved electrical connector having a flexible circuit that can be attached to and detached from one side of a circuit board without tools and without loose fasteners. The electrical connector and contact board cooperate to resist inadvertent contact between the contacts of the flexible circuit and the contacts of the circuit board while connecting or disconnecting the electrical connector and circuit board.

An electrical connector in accordance with the present invention includes a flexible circuit attached to a clamp member, with an elastomeric spring between the flexible circuit and the clamp member. A number of alignment posts are attached to the one side of the circuit board and extend away from the circuit board. The clamp member has a number of notches, with each notch receiving one post. The clamp member is movable along the posts to place the flexible circuit contact field against the circuit board contact field.

A spring assembly is secured to the clamp member to generate a spring force urging the clamp member against the circuit board. The spring assembly includes a spring, a movable cam member to deflect the spring, and a drive to move the cam member. In preferred embodiments the drive is manually operated and tools are not needed to deflect the spring.

The clamp member is placed to one side of the posts and then moved to receive the posts within the notches. This aligns the flexible circuit contact field with the circuit board contact field. The clamp member is then moved along the posts to place the flexible circuit contact field against the circuit board contact field. The spring drive is then actuated to press the clamp member against the circuit board, compressing the elastomeric spring and forming electrical connections between the flexible circuit and the circuit board.

To detach the flexible circuit, the spring drive is actuated again to relieve the spring force, and the clamp member is moved along the posts away from the circuit board to disengage the contact fields.

In a preferred embodiment of the invention the spring is a plate spring attached to the clamp member. The plate spring has notches that receive the posts to enable the clamp member to move along the posts. When the clamp member is against the circuit board, the cam member moves the spring along the posts to engage stop members on the posts. The spring deflects against the stop members and generates the spring force.

The spring drive preferably includes a rotatable shaft carried on the clamp member having a handle. The cam member extends from the shaft for rotational movement. A handle latch holds the latch when the spring is deflected to maintain the spring force. When the handle is released from the latch, the spring plate is free to move to its relaxed condition and remove the spring force.

To prevent inadvertent contact of the contact fields as the posts are being received in the clamp member, the circuit board preferably includes one or more barriers on the one side of the circuit board. The barriers extends above the side of the board and are located beneath the clamp member as the posts are received in the clamp member notches. The barriers space the clamp member away from the circuit board to space the contact fields apart until they are properly aligned with one another.

In a preferred embodiment the barriers are formed as collars on the alignment posts. The collars are adjacent the circuit board and are received into openings in the clamp member when the clamp member is against the circuit board.

The alignment posts are preferably attached to a bolster plate on the opposite side of the circuit board. Threaded connectors extend through the bolster plate and circuit board and into the posts to hold the bottom of the posts against the one side of the circuit board. This enables the stop members to be located the same distance above the circuit board regardless of variations in circuit board thickness.

Other objects and features of the invention will become apparent as the description proceeds, especially when taken in conjunction with the accompanying drawings illustrating the invention.

BRIEF SUMMARY OF THE DRAWINGS

FIG. 15 is a perspective view of two circuit boards like the circuit board shown in FIG. 9 with two electrical connectors mounted on the adjacent edges of the circuit boards and electrically interconnecting the circuit boards; and FIGS. 16, 17, 18, and 19 are side, top, front, and bottom views of the circuit boards and attached electrical connectors shown in FIG. 15.

DESCRIPTION OF THE PREFERRED EMBODIMENT

Figure 1:
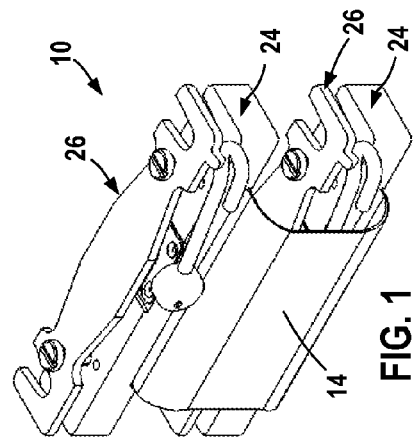
FIGS. 1 and 2 are perspective views of components of an electrical connector in accordance with the present invention.
Figure 2:
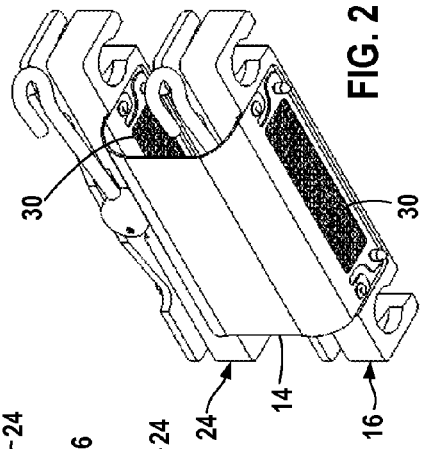
Figure 3:
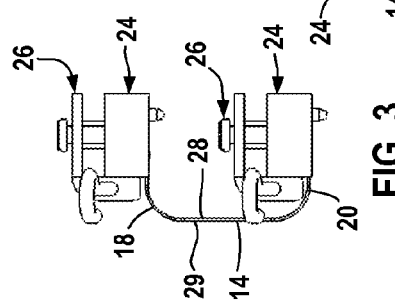
FIGS. 3, 4, 5, and 6 are side, top, front, and bottom views respectively of the components shown in FIG. 1.
Figure 4:
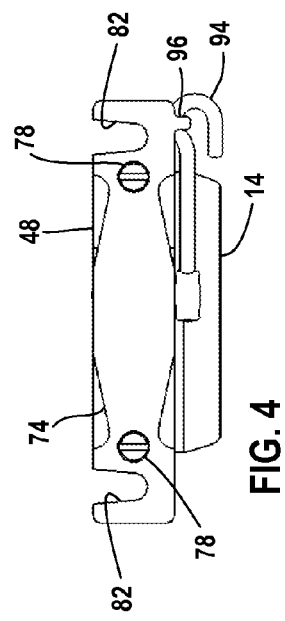
Figure 5:
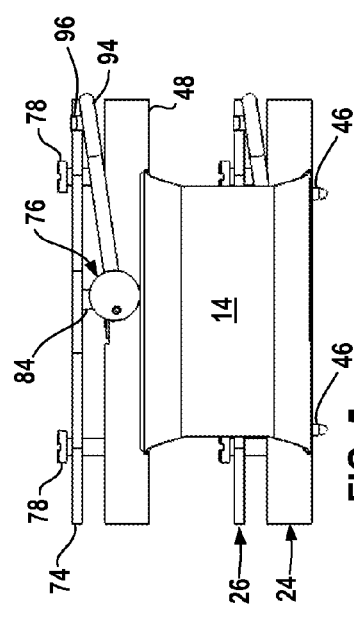
Figure 6:
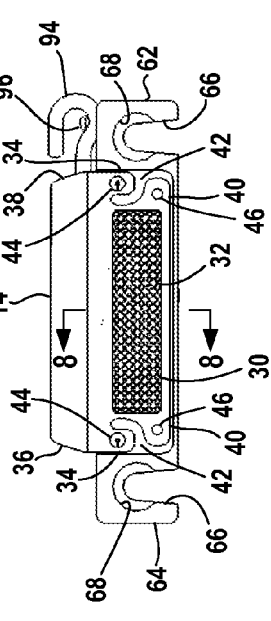
Figure 8:
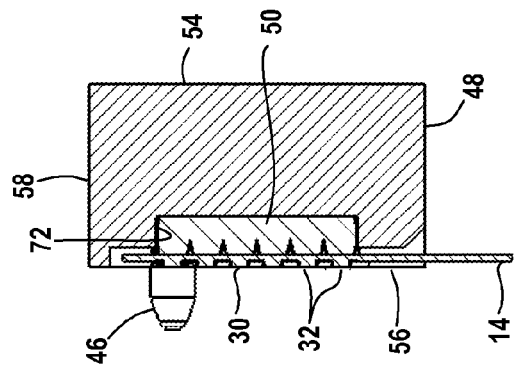
FIG. 8 is a sectional view taken along line 8-8 of FIG. 6, the spring assembly omitted for clarity.
Figure 7:
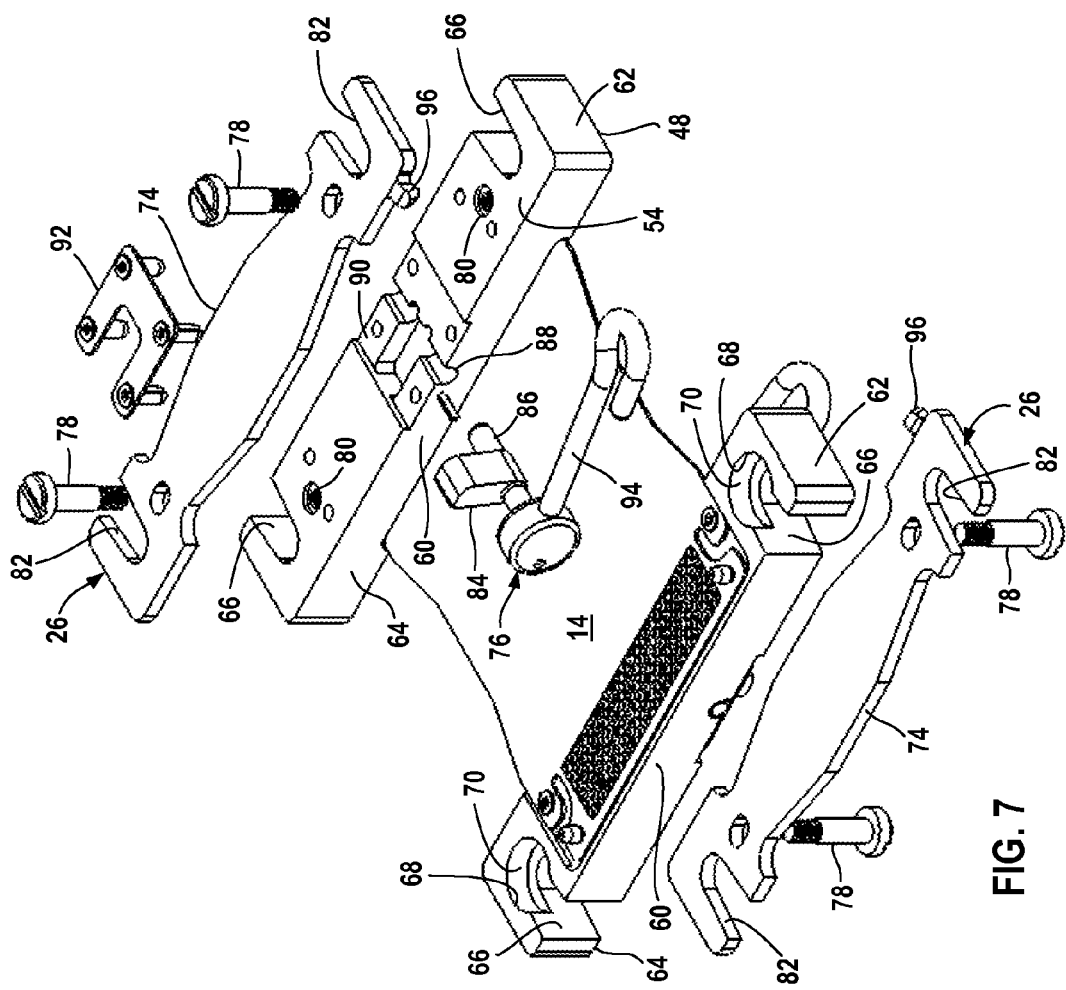
FIG. 7 is an exploded perspective view of the components shown in FIG. 1.
Figure 13:
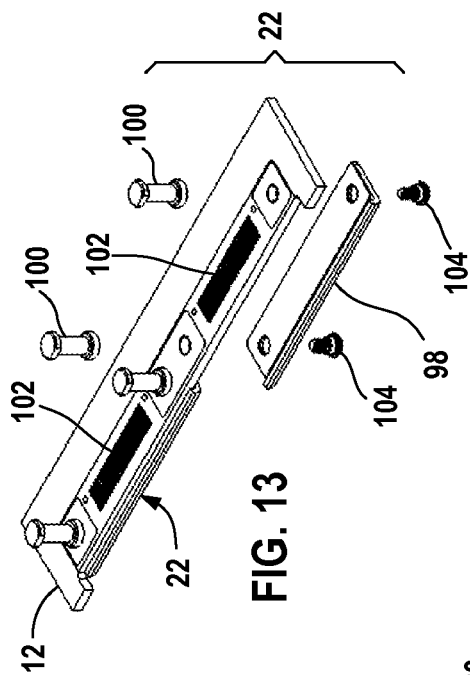
FIGS. 13 and 14 are partially exploded perspective views of the circuit board and post assembly.
Figure 14:
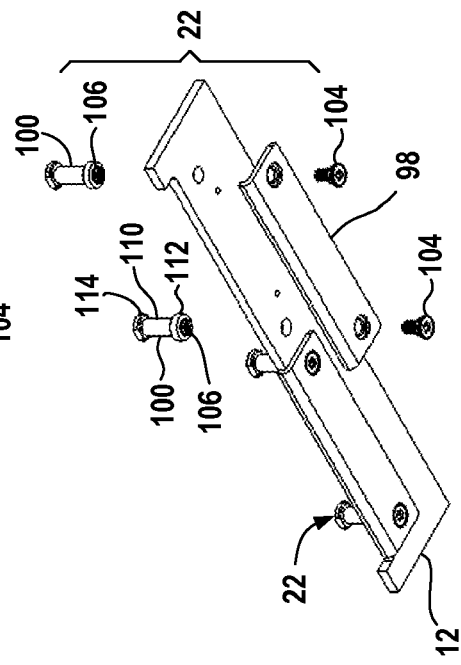
Figure 12:
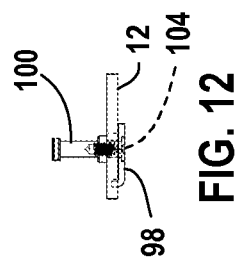
FIGS. 10, 11 and 12 are front, bottom, and end views of a circuit board shown in FIG. 9 having a post assembly of the electrical connector attached to the circuit board.

FIGS. 15 and 16 illustrate two like electrical connectors 10 in accordance with the present invention. Electrical connectors 10 are mounted on the adjacent edges of like printed circuit boards 12. The electrical connectors 10 interconnect sets of electrical contacts on the printed circuit boards.

Each electrical connector 10 includes an elongate flexible circuit or substrate 14, two like connector assemblies 16 on opposite ends 18, 20 of the flexible circuit 14, and two like post assemblies 22 attached to the circuit boards 12. The connector assemblies 16 each include a clamp assembly 24 attached to the flexible circuit 14 and a spring assembly 26. When an end of electrical connector 10 is attached to a circuit board 12, the circuit board 12 is placed between the post assembly 22 and the clamp assembly 24. Spring assembly 26 is actuated to generate a spring force that clamps the circuit board 12 between the clamp assembly 22 and the post assembly 24 to form electrical connections between the circuit board 12 and the flexible circuit 14.

Illustrated electrical connector 10 is used to form electrical connections between a circuit board and another circuit board, with each end of the electrical connector 10 attachable to a circuit board. One of the connector assemblies 16 can be replaced with a different type of connector assembly in other embodiments of the invention to enable an electrical connector 10 to electrically interconnect a circuit board with other types of electrical components.

FIGS. 1-8 illustrate the flexible circuit or substrate 14 and connector assemblies 16 of the electrical connector 10. The flexible circuit 14 has opposite sides 28, 29 and includes a number of copper conductors (not shown) that extend longitudinally along the flexible circuit between the connector assemblies 16. Each end 18, 20 of the flexible circuit 14 has a contact field 30 that includes a number of electrical contacts 32 that connect to the copper conductors. Each contact field 30 is located on one side 28 or 29 of the flexible circuit 14. The illustrated embodiment has the contact fields 30 on opposite sides of the flexible circuit 14. In other embodiments the contact fields 30 can be on the same side of the flexible circuit 14. Each set of contacts 32 is arranged in rows and columns to make electrical connections with corresponding electrical contacts on a circuit board 12.

Each connector assembly 16 overlays the contact field 30 on the end of the flexible circuit 14, with the contacts 32 facing away from the connector assembly 16. The ends 18, 20 of the flexible circuit 14 have like strain relief features that ensure electrical contacts 32 form reliable electrical connections with the contacts on a circuit board 12 even if the flexible circuit 14 is pulled or tugged while a clamp assembly 22 is being connected to the circuit board. These features are described in my co-pending U.S. patent application Ser. No. 11/751,070 titled "Flexible Circuit Connector Assembly with Strain Relief", which application is incorporated by reference as if fully set forth herein, and so are described only briefly here.

These strain relief features on each end 18, 20 of the flexible circuit 14 includes a pair of strain arms 34 that extend along the edges 36, 38 of the flexible circuit and a pair of t-tabs 40 located across from the strain arms 34. Gaps or slots 42 extend between the strain arms 34 and the tabs 40 and between the strain arms 34 and the contact field 30. A pair of connecting members 44 extend through the strain arms 34 and into the connector assembly 16 to mount the flexible circuit 14 to the connector assembly. Alignment pins 46 extend from the connector assembly 16 and through the tabs 40. A thick copper strip (not illustrated) extends along each side of the flexible circuit 14 between the strain arms 34.

The clamp assembly 24 includes a backer or clamp member 48 that supports the end 18 or 20 of the flexible circuit 14 and a compression mat or pressure pad 50 housed in the clamp member 48 adjacent the flexible circuit 12.

Clamp member 48 is a rigid, elongate member that may be made from molded plastic or metal. Clamp member 48 has a top surface 54, an opposite bottom surface 56 to face the printed circuit board, and a side 58 extending between top and bottom surfaces 54, 56.

Flexible circuit 14 is attached to a central portion 60 of the clamp member 48. Adjacent side portions 62, 64 extend from central portion 60 to either side of the flexible circuit 14. A pair of like alignment notches 66 extends into the side portions 62, 64 from side 58 and extends through the thickness of the clamp member 48. Each notch 66 includes a radially-enlarged opening 68 at the closed end of the notch that extends inwardly from bottom surface 56 and partially towards top surface 54. The illustrated openings 68 are each formed as a circular counterbore having a circumferential sidewall 70.

Central clamp member portion 60 includes a number of bores (not shown) that open from the bottom surface 56 to hold the connection members 44 and the alignment pins 46. A recess 72 (see FIG. 8) overlays the flexible circuit 14 opposite the contact field 30 and contains compression mat 50. Compression mat 50 extends outwardly from the clamp member 48 when unstressed so that the mat will compress between the clamp member 48 and the flexible circuit 14 when the clamp member 48 is pressed against the circuit board by the spring assembly 26.

Spring assembly 26 presses the clamp member 48 against the circuit board 12, compressing the compression mat 50 between the clamp member 48 and the circuit board 12. The compression mat 50 generates a spring force pressing the electrical contacts 32 of the contact field 30 against the corresponding electrical contacts of the circuit board 12 to form electrical interconnections.

A compression mat 50 that is preferably used with the present invention is disclosed in my co-pending U.S. patent application Ser. No. 11/751,075 titled "Compression Mat for An Electrical Connector", which application is incorporated by reference as if fully set forth herein, and so it will not be described here. Other types of springs, compression mats and pressure pads for pressing the contacts of a flexible circuit against the contacts of a circuit board are known and can be used with the present invention.

Spring assembly 26 is attached to the clamp member 48 and includes a tapered spring plate 74 and an actuator assembly 76 that deflects the spring plate 74 to generate the spring force pressing the clamp member 48 against the circuit board 12. Spring plate 74 is loosely mounted above clamp member top surface 54 by a pair of spring plate retaining screws 78. Screws 78 extend through holes in the spring plate 74 and into threaded holes 80 formed in the clamp member 48. The heads of the screws 78 are spaced above the top of the clamp member 48 to permit movement of the spring plate 74 towards and away from the clamp member 48.

Spring plate 74 extends the width of clamp member 48 and includes a pair of notches 82 located on the ends of the plate 74. Notches 82 overlay and are aligned with the notches 66 of the clamp member 48 when the spring plate 74 is mounted on the clamp member 48.

Actuator assembly 76 includes a cam member 84 mounted on a rotatable cam shaft 86. The cam shaft 86 is journaled in a groove 88 that forms part of a recess 90 on the top of the central portion 60 of the clamp member 48 and beneath the spring plate 74. The cam shaft 86 rotates the cam member 84 from a retracted position in which the cam member 84 is in the recess 90 to an extended position in which the cam member 84 extends above the clamp member 48 to engage and flex the spring plate 74 as will be described in greater detail below. A cover plate 92 retains the cam shaft 86 in recess 90.

The cam shaft 86 extends outwardly away from the side 58 of the clamp member 48 and includes a radially-extending handle or latch arm 94 away from the clamp member 48 for manual rotation of the cam shaft 86 without the need of tools. Latch arm 94 is oriented to be in a substantially vertical "up" position and extend above the spring plate 74 when the cam member 84 is in the disengaged position. A latch finger or latch retainer 96 extends outwardly from the spring plate 74 and holds the latch arm 94 in place when the cam member 84 is moved to its extended position to flex the spring plate 74. Latch finger 96 can also retain the latch arm 94 when the connector assembly 16 is not attached to a circuit board 12 as shown in FIG. 1

Figure 9:
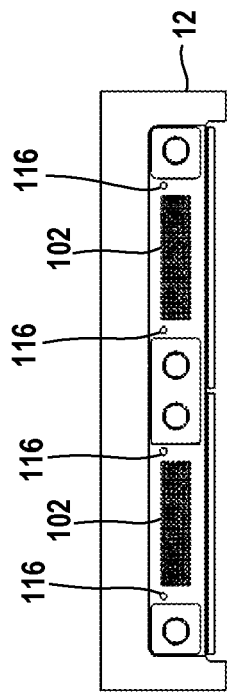
FIG. 9 is a top view of a circuit board.

FIG. 9 illustrates a circuit board 12 adapted for mounting a pair of like post assemblies 22. FIGS. 10-14 illustrate the post assemblies 22 attached to the circuit board 12. Each post assembly 22 cooperates with one connector assembly 16 to attach an end of a flexible circuit 14 to the circuit board.

Each post assembly 22 includes a bolster plate 98 and a pair of like mounting posts 100. The bolster plate 98 is mounted to the side of the circuit board 12 opposite from a circuit board contact field 102. The bolster plate 98 is located directly beneath the contact field 102 and provides mechanical support and added rigidity to the circuit board 12 in the area where the board 12 presses against the clamp member 48. The illustrated bolster plate 98 has a curved lip that extends over an edge of the circuit board 12, but in other embodiments bolster plate 98 can be flat.

Posts 100 are located on opposite sides of the contact field 102 and are spaced apart the same distance as notches 66 and 82. Posts 100 are attached to the same side of the circuit board 12 as the contact field 102, and are connected to the bolster plate 98 by screws 104 that extend through holes in the bolster plate 98 and circuit board 12 and into threaded holes 106 in the bottoms of the posts 100.

Each post 100 is formed as a clasp pin having a shaft 110, a radially-enlarged mounting collar 112 on the bottom end of the shaft, and a radially-enlarge spring retention collar 114 on the upper free end of the shaft. The mounting collar 112 is held against the surface of the circuit board 12 to locate the retention collar 114 a known distance above the circuit board 94, regardless of possible variations in thickness between different circuit boards 12.

Figure 10:
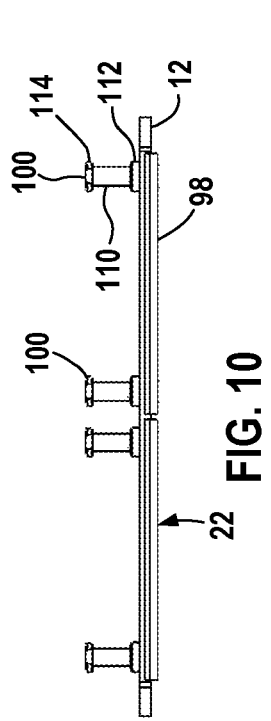
Figure 11:
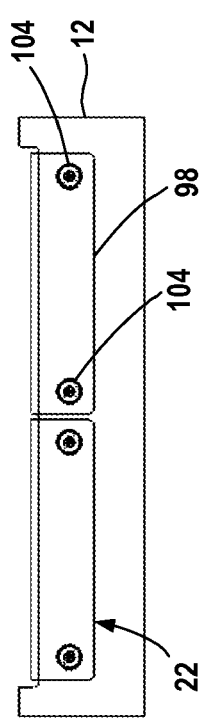

Preferably post assembly 22 is pre-assembled to a circuit board 12 as shown in FIGS. 10 and 11 and the spring assembly 26 is pre-attached to the clamp member 48 as shown in FIGS. 1-6 in the factory so that there is no assembly of these components in the field.

FIGS. 15-19 illustrate two electrical connectors 10, each electrical connector 10 connected between two circuit boards 12. Connection of one connector assembly 16 of an electrical connector 10 to a circuit board 12 is described next, it being understood that the other end of the electrical connector 10 is attached to the other circuit board 12 in the same manner. A post assembly 24 has been pre-installed on the circuit board 12.

Connector assembly 16 is positioned above the circuit board 12 to one side of the mounting posts 100, with the contact field 30 of the flexible circuit 14 facing the circuit board 12. Clamp member notches 66 and spring plate notches 82 are aligned with mounting posts 100. Mounting collars 112 are wider than clamp member notches 66 and form barriers that extend substantially higher than the electrical contacts of the circuit board contact field 102. The bottom surface 56 of the clamp member 48 is held higher than the mounting collars 112 with the notches 66, 82 facing shafts 110 between the mounting collars 112 and retaining collars 114.

Connector assembly 16 is then moved towards posts 100. The bottom surface 56 remains higher than the mounting collars 112 to clear the mounting collar barriers as the shafts 110 are received into the notches 66, 82. The shafts 110 move to the closed ends of the notches 66, 82 The spacing between the bottom clamp surface 56 and the circuit board 12 created by the necessity to clear the mounting collars 112 prevents inadvertent contact between the contacts in the contact fields 30, 102 as the connector assembly 16 moves towards the posts 100.

When the posts 100 reach the ends of the notches 66, 82, notch counterbores 68 are directly above the mounting collars 112 and flexible circuit contact field 30 is directly above circuit board contact field 102.

Connector assembly 16 is then moved downward towards the circuit board 12, with the mounting collars 112 being received in the notch counterbores 68. The notch counterbores 68 are sized to closely receive the mounting collars 112 for gross alignment of the contact fields 30 and 102. Counterbore sidewalls 70 resist lateral movement of the clamp member 48 as the connector assembly 16 moves towards the circuit board 12.

As the clamp member 48 nears the circuit board 12, alignment pins 46 are received in alignment holes 116 (see FIG. 9) in the circuit board 12 for fine alignment of the contact fields 30 and 102. This places each flexible circuit contact 32 directly over the corresponding electrical contact of the circuit board contact field 102.

After the mounting collars 112 are fully received in the notch counterbores 68, the clamp member 48 is against the circuit board 12. The electrical contact pairs in contact fields 30 and 102 are in stacked alignment.

Electrical connections are then established between the contact pairs by manual rotation of the latch arm 94 from the up position to a position generally parallel to the length of the clamp member 48 as shown in FIG. 18. Rotation of the latch arm 94 moves the cam member 84 from its lowered position towards its engaged position. The cam member 84 engages the spring plate 74 and moves the spring plate 74 upwardly along screws 78 and along posts 104. The spring plate 74 reaches and bears against the retaining collars 114 before the cam member 84 reaches its engaged position. The retainer collars 114 secure the ends of the spring plate 74 and prevent further vertical movement of the spring plate ends.

The cam member 84 then begins to deflect the center of the spring plate 74 upwardly while the ends of the spring plate 74 are held against the retaining collars 114. Spring plate 74 bows vertically, applying an upward force to the posts 100 urging bolster plate 98 against one side of the circuit board 12 and applying a downward force to the clamp member 48 urging the clamp member 48 against the other side of the circuit board 12. Compression mat 50 is compressed between the clamp member 48 and the flexible circuit contact field 30. Contact field 30 is free to move vertically along the alignment pins 46 with compression of the compression mat 50, with compression mat 50 applying spring force to each stacked pair of electrical contacts and forming electrical interconnections between them.

When rotated to the compression or clamp position as shown in FIG. 18, the cam member 84 is located shortly to one side of top dead center with respect to the spring plate 74. Latch arm 94 is then flexed downwardly and down a slight distance and released for retention in the clamped position under the latch finger 96.

The end of the circuit connector 10 is disconnected from the circuit board 12 in the reverse order from connection. Latch arm 94 is released from retention finger 96, with stressed spring plate 74 urging cam member 84 back towards its disengaged position. The spring plate 74 relaxes, relieving the clamping force on the clamp member 48. Connector assembly 16 is then moved upwardly along posts 100 until the mounting collars 112 clear the notch counterbores 68. Connector assembly 16 is then moved away from the post shafts 110 until the posts 100 are out of the notches 66, 82.

Connector assembly 16 can be connected to and detached from circuit board 12 without tools and without the use of loose fasteners. While connecting or detaching the connector assembly 16, mounting collars 112 cooperate with notches 66 to resist movement of the connector assembly 16 towards the circuit board 12 while the contact fields 30, 102 are not aligned directly one above the other, preventing inadvertent contact between misaligned contact fields that could damage the contacts.

In other embodiments of the invention, the latch finger 96 can be eliminated. Cam member 84 rotates past top dead center and a clamp member or cover plate wall engages the cam member and holds the cam member in the engaged position.

While I have illustrated and described a preferred embodiment of my invention, it is understood that this is capable of modification, and I therefore do not wish to be limited to the precise details set forth, but desire to avail myself of such changes and alterations as fall within the purview of the following claims.

The invention claimed is:

1. An electrical connector assembly for providing electrical connections to a contact field on a side of a circuit board, the connector assembly comprising:
   a substrate comprising a first side, a second side, and a contact field on the first side, the substrate contact field to be aligned with the contact field of the circuit board for forming electrical connections therebetween;
   a pressure pad on the second side of the substrate opposite the contact field;
   a clamp member for pressing the pressure pad against the second side of the substrate to form the electrical connections between the contact fields;
   a plurality of posts on the circuit board, each post extending away from the circuit board toward the clamp member, the clamp member movable along the posts towards and away from the circuit board; and
   a spring assembly removably secured to the posts to apply a spring force to the clamp member and substrate, the spring assembly comprising a spring, a movable cam member to deflect the spring, and a drive to move the cam member.

2. The electrical connector assembly of claim 1 wherein the spring assembly drive comprises a handle configured for hand operation of the drive without tools.

3. The electrical connector assembly of claim 2 comprising a handle latch to retain the latch when the spring is deflected.

4. The electrical connector assembly of claim 3 wherein the cam member is movable towards a top dead center position with respect to the spring and the handle latch holds the cam member short of the top dead center position.

5. The electrical connector assembly of claim 1 wherein the spring is movable along the posts, and the cam member moves the spring against stop members on the posts to deflect the spring.

6. The electrical connector assembly of claim 5 wherein each stop member is a collar formed on a respective post.

7. The electrical connector assembly of claim 1 wherein the spring comprises a plurality of notches, each notch receiving one post.

8. The electrical connector assembly of claim 1 wherein the spring is attached to the clamp member.

9. The electrical connector assembly of claim 1 wherein the spring is a plate spring.

10. The electrical connector assembly of claim 9 wherein the plate spring comprises a plurality of notches, each notch receiving one post for movement of the plate spring along the posts.

11. The electrical connector assembly of claim 1 wherein the spring assembly drive comprises a rotatable shaft, the cam member attached to the shaft for rotational movement of the cam member.

12. The electrical connector assembly of claim 11 wherein the shaft is supported on the clamp member.

13. The electrical connector assembly of claim 11 comprising a handle attached to the shaft and configured for manual rotation of the shaft without tools.

14. The electrical connector assembly of claim 1 wherein the spring and the clamp member each comprise a plurality of notches, each notch of the spring and each notch of the clamp member receiving one post.

15. The electrical connector assembly of claim 1 wherein each post comprises a collar adjacent the circuit board, and the clamp member comprises a bottom surface and a plurality of openings on the bottom surface, each opening configured to receive a respective collar.

16. A flexible circuit connector assembly for interconnecting a flexible circuit with a circuit board having a contact field on one side of the circuit board, the connector assembly comprising:
   a plurality of alignment posts extending from the one side of the circuit board to upper ends, stop members on the upper ends of the posts;
   a clamp member, a flexible circuit attached to one side of the clamp member, a spring assembly attached to the other side of the clamp member to generate a spring force urging the clamp member against the circuit board, and a compression mat between the clamp member and the flexible circuit;
   the flexible circuit comprising a contact field facing away from the clamp member to form electrical connections with the circuit board contact field;
   the spring assembly comprising a plate spring, a cam member to deflect the plate spring, and a drive to move the cam member against the plate spring to deflect the spring and generate a spring force;
   the clamp member and the plate spring each comprising a plurality of notches, each notch receiving one post to align the clamp member with the circuit board contact field, the clamp member and spring plate movable along the posts to abut the clamp member against the circuit board with the flexible circuit contact field against the circuit board contact field;
   the spring assembly configured to move the plate spring along the posts away from the clamp member and deflect the spring against the stop members to generate the spring force.

17. The flexible circuit connector assembly of claim 16 wherein the plurality of posts comprise a first post and a second post, the circuit board contact field between the first and second posts.

18. The flexible circuit connector assembly of claim 16 wherein the posts are removably mounted to the circuit board.

19. The flexible circuit connector of claim 16 comprising a bolster plate on the opposite side of the circuit board from the circuit board contact field, fasteners extending through the bolster plate and circuit board to mount the posts to the circuit board.

20. The flexible circuit connector of claim 19 wherein the fasteners pull the posts against the one side of the circuit board.

21. The flexible circuit connector of claim 16 wherein the spring assembly drive is configured for manual operation without the need of tools.

22. The flexible circuit connector of claim 16 wherein the spring drive comprises a rotatable shaft mounted on the clamp member, the cam member on the shaft for conjoint movement of the shaft, a handle attached to the shaft, and a handle retainer to hold the latch in an operating position when the spring plate is deflected.

23. The flexible circuit connector of claim 16 wherein each post comprises a collar adjacent the circuit board, and the clamp member comprises a plurality of openings, each opening configured to receive a respective collar when the clamp member is against the circuit board.

* * * * *